(12) United States Patent
Hofrichter et al.

(10) Patent No.: US 9,742,150 B1
(45) Date of Patent: Aug. 22, 2017

(54) OPTICAL AMPLIFIER DEVICES AND SILICON PHOTONIC CIRCUIT DEVICES COMPRISING SUCH OPTICAL AMPLIFIER DEVICES

(71) Applicant: International Business Machines Corporation, Armonk, NY (US)

(72) Inventors: Jens Hofrichter, Gattikon (CH); Folkert Horst, Wettingen (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/257,330

(22) Filed: Sep. 6, 2016

(51) Int. Cl.
*H01S 5/10* (2006.01)
*H01S 5/042* (2006.01)
(Continued)

(52) U.S. Cl.
CPC .......... *H01S 5/1014* (2013.01); *H01S 5/0425* (2013.01); *H01S 5/1203* (2013.01); *H01S 5/227* (2013.01); *H01S 5/3013* (2013.01)

(58) Field of Classification Search
CPC .. H01S 5/1203; H01S 5/3013; H01S 3/06791; H01S 5/227
(Continued)

(56) References Cited

U.S. PATENT DOCUMENTS 5,764,842 A * 6/1998 Aoki ...................... B82Y 20/00
257/18
7,373,048 B2 * 5/2008 Xia ......................... B82Y 20/00
359/341.1
(Continued)

FOREIGN PATENT DOCUMENTS

| JP | 5718007 B2 | 5/2015 | |
|---|---|---|---|
| WO | 2015011606 A1 | 1/2015 | |
| WO | WO 2015 011606 | * 1/2015 | ............... G02F 1/39 |

OTHER PUBLICATIONS

Nitin Jha, et al., "Multicore Optical Fibers for Multi-band Laser and Amplifier," 12th International Conference on Fiber Optics and Photonics, OSA Technical Digest (online) (Optical Society of America, 2014), paper M2A.5.
(Continued)

*Primary Examiner* — Tuan Nguyen
(74) *Attorney, Agent, or Firm* — Daniel P. Morris, Esq.; Otterstedt, Ellenbogen & Kammer, LLP

(57) ABSTRACT

An optical amplifier device includes: an optical waveguide core; an active gain material layer stack; and a dielectric material between the active gain material layer stack and the optical waveguide core. The optical waveguide core includes an input portion, a middle portion, an output portion and tapers. The middle portion is connected to the input and output portions via the tapers. The tapers widen outwardly, whereby the middle portion has an effective refractive index that is smaller than an effective refractive index of any of the input and output portions. The active gain material layer stack includes III-V semiconductor material layers having different refractive indices so as to possess an effective refractive index that is larger than the effective refractive index of the middle portion. The active gain material layer stack extends relative to a subsection of the optical waveguide core that includes the middle portion and tapers.

20 Claims, 4 Drawing Sheets

(51) Int. Cl.
    *H01S 5/12*       (2006.01)
    *H01S 5/30*       (2006.01)
    *H01S 5/227*     (2006.01)

(58) Field of Classification Search
    USPC ............................................. 372/43.01, 45.01
    See application file for complete search history.

(56) References Cited

U.S. PATENT DOCUMENTS

| | | | |
|---|---|---|---|
| 7,486,247 B2 * | 2/2009 | Ridgway | ................ G02F 1/065 343/767 |
| 8,565,272 B2 | 10/2013 | Shkunov et al. | |
| 8,929,692 B2 | 1/2015 | Iwai et al. | |
| 9,001,414 B2 | 4/2015 | Mattsson et al. | |

OTHER PUBLICATIONS

Isaac Suarez, "Polymer/Perovskite Amplifying Waveguides for Active Hybrid Silicon Photonics," Adv. Mater. Oct. 28, 2015;27(40):6157-62. doi: 10.1002/adma.201503245. Epub Aug. 31, 2015.

* cited by examiner

OPTICAL AMPLIFIER DEVICES AND SILICON PHOTONIC CIRCUIT DEVICES COMPRISING SUCH OPTICAL AMPLIFIER DEVICES

BACKGROUND

The invention relates generally to the field of optical amplifier devices and silicon photonic circuit devices comprising such optical amplifier devices, and, more particularly, relates to optical amplifier devices with active gain layer stacks of III-V semiconductor material layers.

Silicon photonics relate to photonic systems, where silicon is used as a medium for light propagation because of the material's low optical loss. Silicon photonics makes use of well-established silicon manufacturing principles exploited in complementary metal-oxide semiconductor (CMOS) electronics. The features are usually patterned into microphotonic components with sub-micron precision (to operate in the infrared). Silicon-on-insulator (SOI) is typically used as a material of choice. The fabrication of silicon photonic devices can otherwise involve known semiconductor fabrication techniques; since silicon is already used as a substrate of choice for most integrated circuits, it is possible to create hybrid devices in which the optical and electronic components are integrated onto a single chip.

Integrated optical interconnects with compatible light sources are needed for mass-fabrication of low-cost, high-performance CMOS-based chips. Due to the indirect band gap of silicon, no Si-based light source is available. Efficient light sources are typically based on III-V semiconductors which are heterogeneously or hybrid integrated on a Si photonics platform.

Most promising approaches resort to bonding a full epitaxial III-V-based gain layer stack, or a thin seed layer, which may be subject to successive re-growth, on top of the silicon photonic waveguides. The III-V stack need typically be laterally structured, which requires a sensitive etch step.

SUMMARY

According to a first aspect, the present invention is embodied as an optical amplifier device. The latter comprises: an optical waveguide core; an active gain material layer stack; and a dielectric material between the active gain material layer stack and the optical waveguide core. The optical waveguide core comprises silicon and is structured so as to comprise: an input portion; a middle portion; an output portion; and tapers. The middle portion is connected to the input portion and the output portion via the tapers. The tapers widen outwardly, whereby the middle portion has an effective refractive index that is smaller than an effective refractive index of any of the input portion and the output portion. The active gain material layer stack comprises a stack of III-V semiconductor material layers stacked along a first direction x, said layers having different refractive indices so as for the active gain material layer stack to have an effective refractive index. The latter is larger than the effective refractive index of the middle portion. The active gain material layer stack is otherwise structured so as to comprise two opposite ends, including a first end and a second end. The active gain material layer stack extends, from said first end to said second end, relative to a subsection of said optical waveguide core that comprises said middle portion and said tapers.

According to another aspect, the invention is embodied as a silicon photonic circuit device. This silicon photonic circuit device comprises the above optical amplifier device. In embodiments, the photonic circuit device further comprise a CMOS front-end-of-line or a bipolar CMOS front-end-of-line.

Devices embodying the present invention will now be described, by way of non-limiting examples, and in reference to the accompanying drawings.

BRIEF DESCRIPTION OF THE SEVERAL VIEWS OF THE DRAWINGS

The accompanying drawings show simplified representations of devices or parts thereof, as involved in embodiments of the invention. Technical features depicted in the drawings are not necessarily to scale. In FIGS. 1-5, the contours of concealed elements are depicted using dashed lines. Similar or functionally similar elements in the figures, where used, have been allocated the same numeral references, unless otherwise indicated.

DETAILED DESCRIPTION OF EMBODIMENTS OF THE INVENTION

Figure 1:
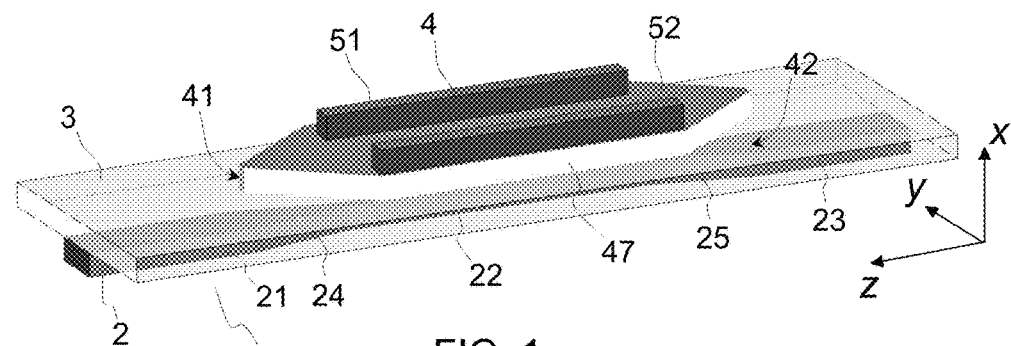
FIG. 1 is a 3D view of an optical amplifier device, according to first embodiments.
Figure 2:
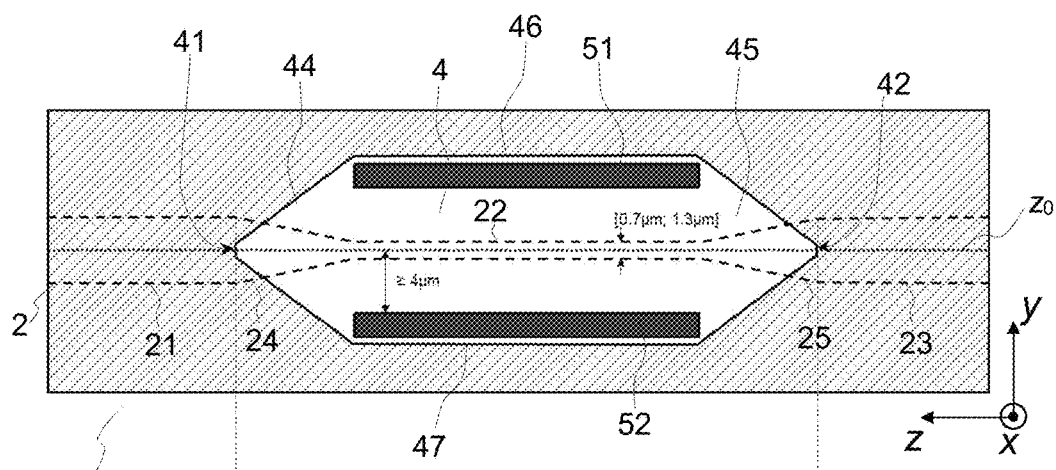
FIG. 2 is a top view of the device of FIG. 1.
Figure 3:
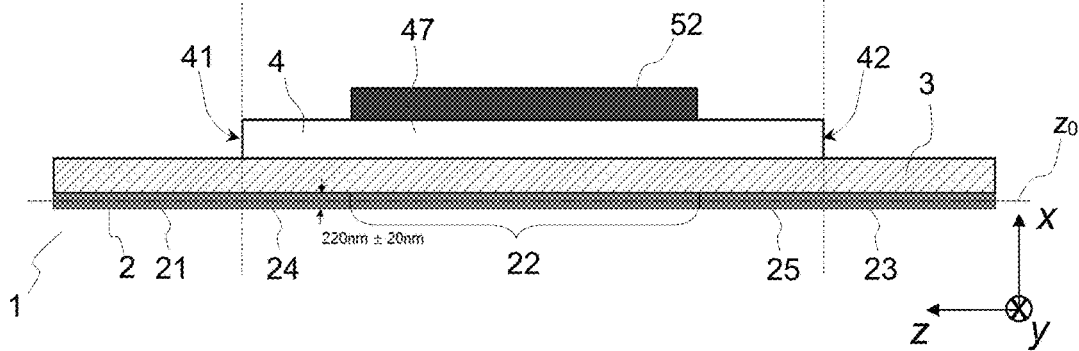
FIG. 3 is a side view of the device of FIG. 1.
Figure 4:
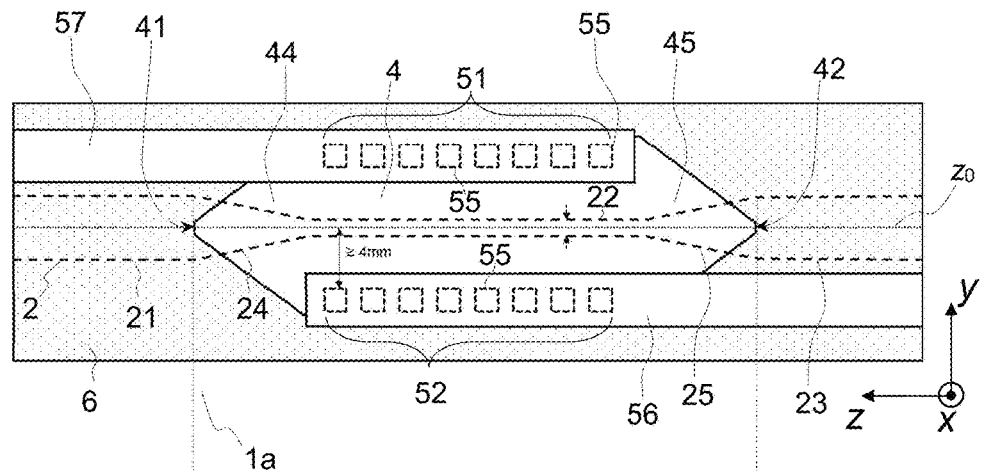
FIG. 4 is a top view of an optical amplifier device, according to second embodiments.
Figure 5:
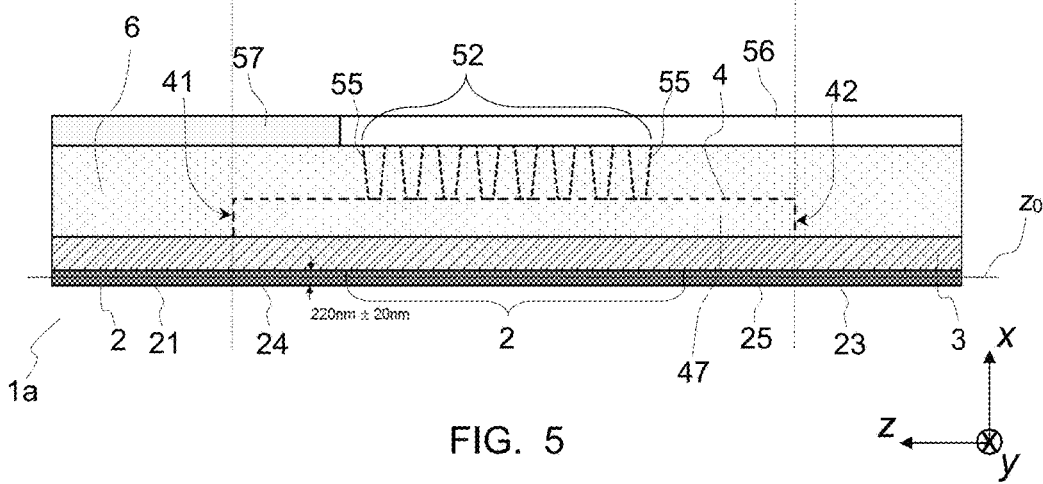
FIG. 5 is a side view of the device of FIG. 4.

In reference to FIGS. 1-5, an aspect of the invention is first described, which concerns an optical amplifier device 1, 1a. FIGS. 1-3 depicts a first type of device 1, having simple electrical contacts on top. FIGS. 4-5 illustrate a device 1a with more sophisticated electrical contacts.

Basically, the optical amplifier device 1, 1a comprises: an optical waveguide core 2; an active gain material layer stack 4; and a dielectric material 3 arranged between the active gain material layer stack 4 and the optical waveguide core 2.

In detail, and as seen in FIGS. 1-5, the optical waveguide core 2 generally extends longitudinally along direction z. The optical waveguide core 2 comprises silicon and is structured so as to exhibit several subsections, the latter comprising an input portion 21, a middle portion 22 an output portion 23, as well as first tapers 24, 25. The middle portion 22 is connected to the input portion 21 and the output portion 23 of the waveguide core 2 via the tapers 24, 25.

The tapers 24, 25 widen outwardly, i.e., they widen, each, toward one of the input portion 21 and the output portion 23 of the waveguide core 2, such that an average cross-sectional area of the middle portion 22 is smaller than an average cross-sectional area of any of the input portion 21 and the output portion 23. That is, a narrow end of each of the first tapers 24, 25 has a cross-sectional area that is smaller than the average cross-sectional area of any of the input portion 21 and the output portion 23.

As a result, the middle portion 22 has an effective refractive index that is smaller than an effective refractive index of any of the input portion 21 and the output portion 23. The waveguide core 2 can be regarded as a passive optical waveguide core material (silicon) that has no optical amplification functionality.

The active gain material layer stack 4 comprises a stack of III-V semiconductor material layers 410-450 (see also FIG. 8), which are stacked along a first direction x, i.e., the vertical direction in FIGS. 1, 3 and 5.

In the embodiments depicted in the appended drawings, the layers of III-V materials otherwise extend, each, in a plane parallel to the plane (y, z), subtended by a second direction y and a third direction z, the directions x, y, z being perpendicular two by two, as assumed in the accompanying drawings. In addition, the average, longitudinal extension direction $z_0$ of the middle portion 22 extends in the transverse plane (x, z), parallel to the third direction z. In fact, as seen in the appended drawings, the waveguide core 2 generally extend parallel to said direction z.

The layers 410-450 have different refractive indices. In the present context, these layers are designed, in combination, so as for the active gain material layer stack 4 to have an effective refractive index that is larger than the effective refractive index of the middle portion 22. The active gain material layer stack 4 is otherwise structured so as to comprise two opposite ends 41, 42 (i.e., a first end 41 and a second end 42). For reasons that will become apparent later, the active gain material layer stack 4 need not be finely structured laterally (along z).

In particular, the surface roughness of the opposite ends 41, 42 may differ from that of the lateral surfaces 46, 47; i.e., the opposite ends 41, 42 may benefit from a cleaner patterning process and thus exhibit less deviations from its ideal, flat form, than the lateral surfaces 46, 47.

As seen in FIGS. 2 and 4, the active gain material layer stack 4 generally extends in a plane parallel to the plane (y, z). In particular, it extends from said first end 41 to said second end 42 along the longitudinal direction z. The active gain material layer stack 4 further extends relative to, for example, above a subsection 24, 22, 25 of the optical waveguide core 2, which subsection comprises said middle portion and the tapers; that is, the active gain material layer stack 4 extends, from said first end 41 to said second end 42, vis-à-vis (i.e., relative to) the first taper 24, the middle portion 22 and the second taper 25 of the waveguide core 2.

Additional cladding material 6 may typically be present (not shown in FIGS. 1-3), e.g., covering both the layer 3 and the gain layer stack 4. Each of the layers 3 and 6 comprises a dielectric material, which can be, e.g., $SiO_2$. The material 6 may clad the gain stack 4 and the dielectric material 3 from the top, see FIGS. 4-5.

The passive waveguide has an effective index, which notably depends on its thickness and width. In the gain region, i.e., compared with the gain layer stack, the width of the passive waveguide is restricted by means of the input taper 24. Thus, in the region 22, the effective index of the passive waveguide 2 sinks below the effective index of the active gain layer stack 4. This makes it possible to transfer most of the optical power to the gain layer stack 4, for light to be essentially confined in the III-V stack. At the output 25 the optical coupling process is reversed.

The structure of the devices shown in FIGS. 1-5 does not require any transversal, light confinement in the gain layer 4. Thus, the active gain material layer stack 4 need not be precisely structured laterally (along surfaces 46, 47), contrary to usual III-V gain stack designs, where a sensitive patterning process is usually used to process all lateral surfaces. For example, when considering a cross-section of the gain layer in the plane (x, y), the gain layer does not need fine structuring at the left and right sides 46, 47 to confine the light.

As the active gain material layer stack 4 need not be precisely structured laterally, no lateral sensitive etch step is required at fabrication. In particular, no micro-patterning of the III-V gain stack is required. The lateral structuring can be done relatively far from the optical field and, this, by using simple fabrication processes. Namely, no non-standard fabrication steps are required, beyond, e.g., DUV lithography, standard etching (wet or dry) and metallization.

The devices 1, 1a can be regarded as a strip loaded waveguide structure, involving a III-V gain stack in the slab waveguide, which gain stack does not require precise lateral patterning. The strip structure of the waveguide core, which can more easily be patterned to include additional features such as gratings and mirrors, plays the role of the light guiding structure. As per the strip loaded waveguide structure, light can essentially propagate through the slab waveguide (a majority of the optical power remains in the slab region) without precise lateral structures being needed to confine and guide the light.

Power distribution between strip and slab waveguide can nevertheless be adjusted by suitably structuring the strip waveguide 2. Also, a good overlap can be obtained with the gain region, by precisely structuring the waveguide 2. That is, the precise patterning can be done in mature (silicon) integrated technology, such that an efficient laser device can be fabricated. Yet, the present approach does not require non-standard (i.e., pricy) top silicon thicknesses.

In addition, and as it may be realized, the present approach does not require a thick gain region: the epitaxial material used to fabricate the gain layer stack does not require a thick p-type epitaxy for modal separation. This too contributes to reduce the fabrication costs as the growing time is reduced. As a result, low-power, low-threshold lasers can be fabricated and used to extend capabilities of silicon photonics devices.

Embodiments such as described below make use of a combination of device geometry, epitaxial material stacks and top silicon wafer material that enables improved performances, process compatibility and ease of fabrication, which altogether allows the bill-of-materials to be reduced. Of particular interest is that the present amplifier devices are, by design, compatible with front-end-of-line FEOL integration approaches such as described in WO2014/083507.

As illustrated in FIGS. 1-5, the present optical amplifier devices 1, 1a may, in embodiments, further comprise two sets 51, 52 electrical contacts, on top of the gain stack 4. Each set of electrical contacts comprises at least one contact, e.g., a metal contact. Electrical contacts are typically fabricated at a final stage of the fabrication. The electrical contacts are configured so as to be in electrical communication with the active gain material layer stack 4. The electrical contacts can be placed laterally, on top of the gain stack, to reduce optical losses.

Specifically, in one or more embodiments, each of the electrical contacts is offset by a minimal distance (measured along direction y) with respect to a transverse plane, which is parallel to the plane (x, z). This transverse plane comprises the average, longitudinal extension direction $z_0$ of the middle portion 22. The minimal distance may, for instance, be greater than or equal to about 3 µm (or preferably 4 µm), which appears to substantially reduce optical losses (e.g., to below about 0.5 dB/cm). More preferably, in one or more embodiments, the minimal distance is at least equal to 5 µm, which results in negligible optical losses.

Furthermore, it can be shown that light is best confined in the silicon waveguide 2 in a region that spans a restricted width; e.g., between about 0.7 µm and 1.3 µm. Accordingly, in one or more embodiments, the average width of the middle portion 22 of the waveguide core 2 is taken between 0.7 and 1.3 µm. This width, like all other widths mentioned herein, is measured along direction y; see FIG. 2 or 4. The confinement is particularly efficient if the average width of the middle portion 22 is further restricted to be between about 0.8 and 1.2 µm; e.g., a preferred width is 1.0 µm, in one or more embodiments.

As illustrated in FIGS. 1-5, the active gain material layer stack 4 is optionally structured so as to exhibit tapers 44, 45 (hereafter referred to as "second tapers"), which narrow outwardly, contrary to the waveguide core tapers 24, 25, to ease light coupling. The second tapers 44, 45 narrow towards said the opposite ends 41, 42, respectively. The second tapers 44, 45 otherwise extend relative to the first tapers 24, 25, respectively.

Figure 10:
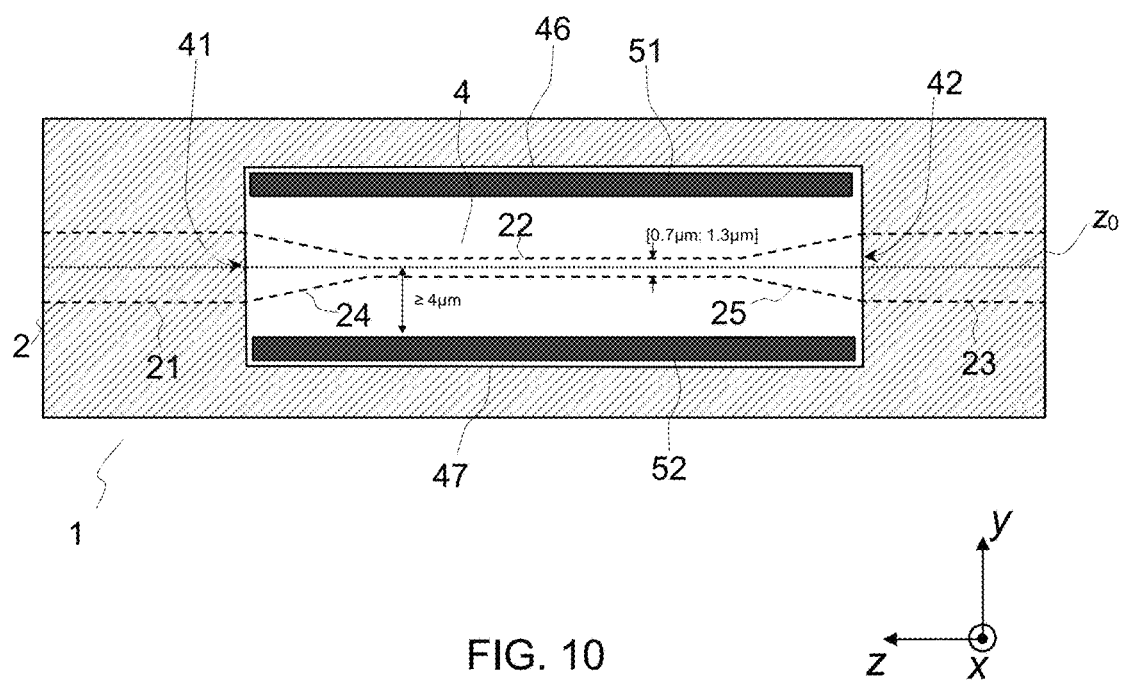
FIG. 10 is a top view of a variant to the device of FIG. 1, where the stack of III-V semiconductor material layers is not tapered.

The second tapers 44, 45 may for instance precisely extend relative to the first tapers 24, 25, i.e., so as for the gain stack 4 to have has a footprint (measured along z) that is substantially equal to that of the subsection 24, 22, 25 of the waveguide core 2, to favor optical coupling. For example, the first end 41 of the gain stack 4 may be opposite to the wide end of the taper 24, and the second end 42 may be opposite to the wide end of the taper 25. However, as electrodes 51, 52 cannot substantially extend in the taper regions 44, 45, the latter cannot be optimally pumped (electrically), which causes, in turn, a loss. Thus, in preferred embodiments such as depicted in FIG. 10, the active gain material layer stack does not comprise any taper. In turn, electrodes 51, 52 can be made longer. Similarly, variants to FIGS. 4-6 can be contemplated where the active gain material layer stack is not tapered.

In all cases (tapered or not), the ends 41, 42 of the gain stack 4 are preferably shaped as substantially flat sections, as assumed in FIGS. 1-5. Their width may generally be between 0.1 and 1 µm (as measured along y). This way, a relatively large feature size (i.e., of more than 0.1 µm) is maintained at these ends, to ease fabrication. In embodiments, the width of each of the opposite ends 41, 42 is less than 500 nm, e.g., it may be of approximately 250 nm, or 200 nm. By providing a III-V gain stack with widths between 0.1 and 0.5 µm, less than 1% of the optical power may remain in the III-V gain stack 4 at the level of the out-coupling, based on observations of 2D eigenmode expansion computations. Thus, reducing the width of each of the opposite ends 41, 42 makes it possible to transfer light almost entirely from the Si waveguide 2 to the III-V stack 4, and conversely from the III-V stack 4 to the waveguide 2.

Referring now more particularly to FIGS. 2, 4, the average width of each of the input portion 21 and the output portion 23 is, in embodiments, of at least 2.0 µm (again measured along y). Particularly efficient light transfers and confinements can for instance be obtained using average widths of 2.5 µm for each of the portions 21, 23, together with taper tips 41, 42 less than 250 nm.

In embodiments, the average thickness of the optical waveguide core 2 is preferably of 220 nm±20 nm, see FIGS. 1, 3 and 5. Thicknesses mentioned herein are all measured along direction x. In other words, a standard silicon wafer may be used to fabricate the waveguide core 2. An oxide layer formed on top will typically have a thickness that is less than 200 nm. Also, the average thickness of the dielectric material 3 is typically between 150 nm and 300 nm (especially if $SiO_2$ is used). The thickness of the dielectric material 3 is measured at the level of the gain layer stack 4. The dielectric layer 3 may otherwise be structured and thus exhibit different thicknesses away from the gain layer stack 4.

As seen in FIGS. 1-5, each of the sets 51, 52 of electrical contacts may have a longitudinal shape and extend longitudinally along respective extension directions (parallel to z). As noted earlier, the offset between each of the extension directions of the sets 51, 52 and said transverse plane is preferably of 3 µm or more, e.g., of at least 4 or 5 µm.

The two sets 51, 52 of electrical contacts preferably have substantially a same length along their respective extension directions. The two sets 51, 52 of electrical contacts may have, each, a length that is substantially equal to the length of the middle portion 22 (measured along z), if tapers 44, 45 are present, or to the length of the active gain material layer stack (if not tapered).

The cladding material 6 preferably coats both the dielectric layer 3 and the gain stack 4, so as to provide a residual thickness on top of the gain stack 4. In the embodiment of FIGS. 4 and 5, each of the two sets 51, 52 of electrical contacts comprises vias 55, formed in this residual thickness. The vias 55 are, each, filled with a metallic material that contacts the gain layer stack 4, so as to form said electrical contacts. The fabrication of the optical amplifier device 1a can be completed by forming two elongated metal pads 56, 57, on top of a cladding material 6. The two metal pads 56, 57 contact the filled vias 55. As noted earlier, the electrical contacts can be fabricated at a final stage.

In embodiments, the average thickness of the cladding material 6 is between 500 nm and 2 000 nm, depending on the thicknesses chosen for the gain stack 4 and the vias 55. This thickness is measured away from the region of the gain layer stack 4 and corresponds to the distance (as measured along x) between the upper contact pads 56, 57 and the dielectric layer 3.

The optical amplifier devices 1, 1a described above are preferably configured as laser devices. For instance, referring to FIGS. 6, 7, the optical waveguide core 2 may, in embodiments, be structured so as to comprise one or more distributed feedback reflectors 221, 223, arranged in the middle portion 22 of the waveguide core 2. For example, the middle portion 22 may comprise two subsections, structured so as to form distributed feedback reflectors 221, 223. A quarter-wavelength shifted distributed feedback cavity 222 may be provided between the two subsections.

Figure 9:
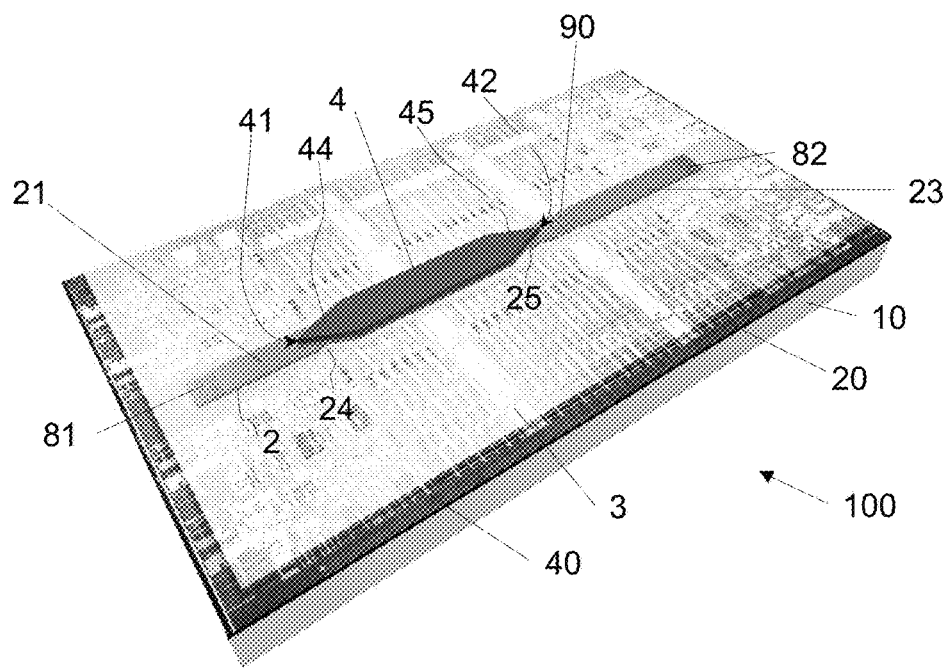
FIG. 9 is a 3D view of a silicon photonic circuit device, at a given stage of fabrication, according to embodiments.

In addition, or in variants, the waveguide core 2 may further be structured so as to exhibit light couplers 81, 82 and a reflector 90, as depicted in FIG. 9.

Figure 6:
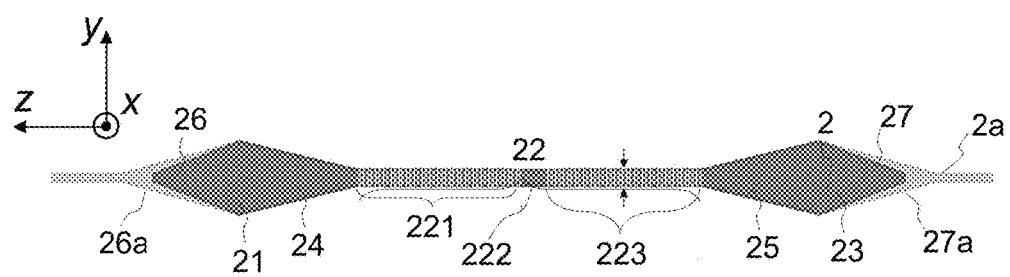
FIG. 6 is a top view of an optical waveguide core structured on top of a silicon sublayer, so as to comprise distributed feedback reflectors, as involved in embodiments of the present optical amplifier devices.
Figure 7:
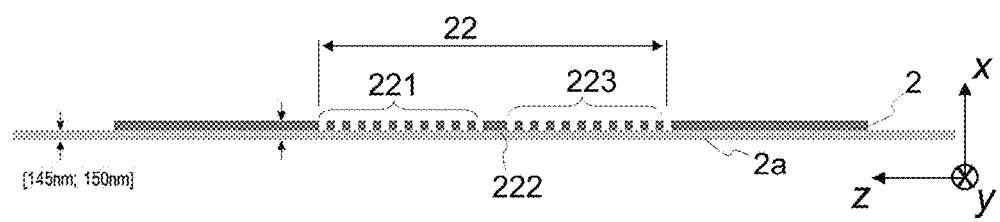
FIG. 7 is a 2D cross-sectional view of FIG. 6.

The fabrication of the distributed feedback reflectors 221, 223 and other structures 81, 82, 90 can be facilitated by providing an additional silicon layer 2a, forming part of the waveguide core, onto which an upper layer 2 of the optical waveguide core can be structured. The silicon sublayer 2a is opposite to the dielectric layer 3 with respect to the upper, structured sublayer 2 of the optical waveguide core. As seen in FIGS. 6, 7, the silicon sublayer 2a can be laterally structured, correlatively with the upper sublayer 2, e.g., so as for these to exhibit additional, outward tapers 26, 26a, 27, 27a and, this, to ease the guiding and coupling of light. The thickness of sublayer 2a is typically between 145 and 150 nm.

Typically, fabrication starts with an SOI wafer having a top silicon thickness of 220 nm. In grating sections (e.g., sections 221 and 223 in FIG. 7), the silicon is etched down to about 145 nm. For devices working at a wavelength window around 1300 nm, the standard passive waveguide (2a in FIG. 7) routing light between various photonics devices is etched down to 145 nm as well. For devices working at the wavelength window around 1550 nm, the passive waveguides are kept at a thickness of 220 nm.

Referring now to FIG. 9, according to another aspect, the invention can be embodied as a silicon photonic circuit device 100, which notably comprises an optical amplifier device 1, 1a such as described above. Although only one optical amplifier device is shown in FIG. 9, it is to be appreciated that the silicon photonic circuit device 100 may include more than one optical amplifier device, according to one or more alternative embodiments.

In embodiments, the photonic circuit device 100 may further comprise a CMOS front-end-of-line (FEOL) or a bipolar CMOS FEOL, in which said optical waveguide core 2, 2a is arranged. I.e., passive silicon photonics circuitry, including the optical waveguide core of the amplifier, can be made in the CMOS FEOL. The amplifier is typically completed by: adding the active III-V layer stack on top of the CMOS wafer; structuring the added III-V layer stack; adding electrodes and cladding layers; and finally adding the CMOS back-end-of-line.

For example, and as illustrated in FIG. 9, the photonic circuit device 100 may comprise a wafer 10 and a buried oxide layer 20, with electronics 40 on top and passive photonics. The wafer 10 is preferably a silicon wafer but may also be made from Gallium Arsenide (GaAs) or Indium Phosphide (InP). The substrate may notably comprise: a silicon photonic circuit; a passive InP photonic circuit; or a passive GaAs photonic circuit. The electrical circuit comprising electronics 40 is CMOS front end.

The embodiment of FIG. 9 further involve additional light-coupling means 81, 82, e.g., grating couplers, and a reflector 90, in addition to a waveguide core 2 and a gain stack 4 on top, similar in configuration to those described earlier in reference to FIGS. 1-7 (the cladding 6 and the metal contacts are not shown in FIG. 9). The tapered couplers 24, 25, 44, 45 are shaped and placed such as to enable an adiabatic coupling of light between the active gain section 4 and the waveguide code 2 (adiabatic, meaning no substantial loss and no substantial back reflection). The tapered couplers may have an essentially parabolic shape, i.e., lateral edges of the tapered portions may be essentially parabolic or, more generally, nonlinear. The design of the tapered portions can be optimized to allow a smooth transformation of the optical mode and ensure minimal scattering to unwanted modes.

The active gain section 4 could be bonded directly, using molecular bonding or a layer of polymer or $SiO_2$ or, still, a bilayer of $Al_2O_3$ and $SiO_2$ or a combination thereof. However, using a bilayer of $Al_2O_3$ and $SiO_2$ is preferred because $SiO_2$ is a standard material in CMOS processes and $Al_2O_3$ improves the bonding energy. The waveguide core 2 can be in contact with a bonding layer, typically a polymer, $SiO_2$ or $Al_2O_3$ (or any combination thereof). Again, a bilayer of $Al_2O_3$ and $SiO_2$ could serve as an interface. This dielectric layer provides a lower cladding for the waveguide core, while providing a thermal and mechanical interface to the wafer. The dielectric layer can thus advantageously be used to tune the mechanical and thermal properties of the device.

In variants, the waveguide core 2 and the stack 4 can be imbedded, at least partly, in one and a same dielectric layer 3, 6.

Figure 8:
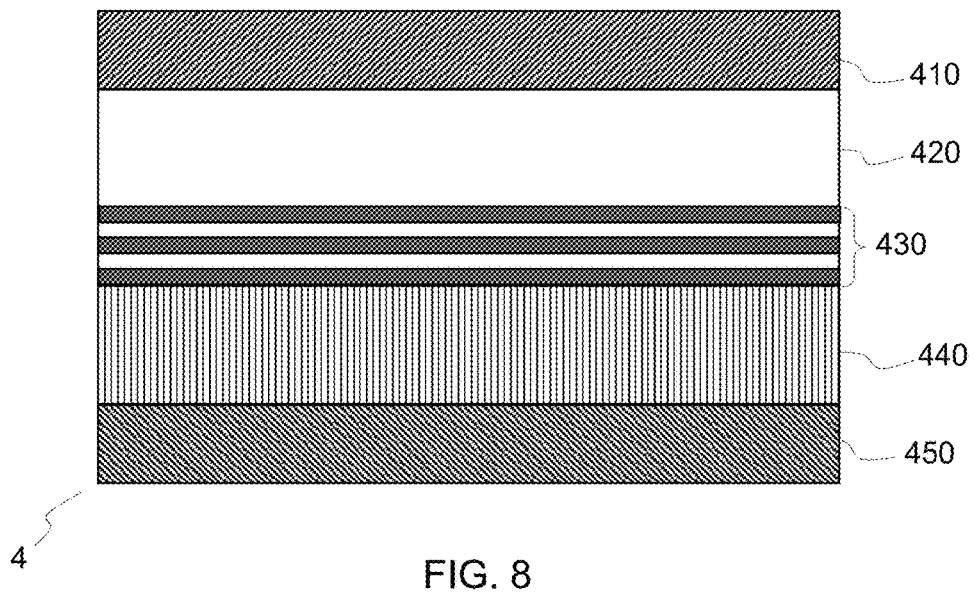
FIG. 8 is a 2D cross-sectional view of a stack of III-V semiconductor material layers, as involved in embodiments.

The gain stack 4 is now described in more detail, in reference to FIG. 8, which depicts a sectional view of an epitaxial layer stack of III-V semiconductor material layers 410-450. The latter may notably comprise:
 a first intrinsic semiconductor 440, arranged on top of an n-doped semiconductor 450;
 a multiple quantum well section 430 on top of said first intrinsic semiconductor 440;
 a second intrinsic semiconductor 420 on top of the multiple quantum well section 430; and
 a p-doped semiconductor 410 on top of the second intrinsic semiconductor.

Note that the terminology "intrinsic semiconductor" as used above is intended to refer to an "unintentionally doped semiconductor." That is, a doping level of the semiconductor material is essentially determined by its fabrication (e.g., growth conditions, precursor material chosen, etc.), rather than by intentionally adding doping species to the material.

The above layer stack is easy to grow, e.g., by molecular beam epitaxy (MBE) or by metal-organic chemical vapor deposition (MOCVD). In particular, the above structure has the advantage that the n-doped section is in proximity with the waveguide core 2. This is particularly advantageous as the p-doped section typically has a ten-times higher optical loss for a same doping level or concentration of dopants residing in the contact layers 410 and 450, respectively. The semiconductor materials 410-450 can be doped, if necessary, and preferably in conjunction with strain, e.g., to tune the bandgap.

In variants, the gain stack may further include a tunnel junction enabling to terminate the device with a n-contact on either side, such that only one type of contact metal needs be applied, e.g., gold, tungsten, titanium, etc., it being reminded that, normally p- and n-doped regions use different types of metal to match the Fermi-levels and reduce the contact resistance.

While the present invention has been described with reference to a limited number of embodiments, variants and the accompanying drawings, it will be understood by those skilled in the art that various changes may be made and equivalents may be substituted without departing from the scope of the present invention. In particular, a feature recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly described herein are contemplated and fall within the scope of embodiments of the invention. For example, other materials than those explicitly mentioned may be involved.

What is claimed is:

1. An optical amplifier device, comprising:
 an optical waveguide core comprising silicon, the optical waveguide core including: an input portion; a middle portion; an output portion; and tapers, the middle portion connected to the input portion and the output portion via the tapers, the latter widening outwardly, whereby the middle portion has an effective refractive index that is smaller than an effective refractive index of any of the input portion and the output portion;

an active gain material layer stack comprising a stack of III-V semiconductor material layers stacked along a first direction x, said stack of III-V semiconductor material layers having different refractive indices relative to one another such that the active gain material layer stack has an effective refractive index, the latter being larger than an effective refractive index of the middle portion, wherein the active gain material layer stack comprises two opposite ends, including a first end and a second end, the active gain material layer stack extending, from said first end to said second end, relative to a subsection of said optical waveguide core that comprises said middle portion and said tapers, the active gain material layer stack having a footprint substantially equal to that of the middle portion and the tapers of the optical waveguide core;

a dielectric material layer between the active gain material layer stack and the optical waveguide core; and electrical contacts in electrical communication with the active gain material layer stack, the electrical contacts having a length along an extension direction of the contacts that is substantially equal to a length of the active gain material layer stack.

2. The optical amplifier device according to claim 1, wherein the electrical contacts comprise two sets of one or more electrical contacts in electrical communication with the active gain material layer stack, each of the electrical contacts being offset by a minimal distance, as measured along a second direction y, with respect to a transverse plane subtended by said first direction x and a third direction z, and wherein:

the first direction x, the second direction y and the third direction z are perpendicular two by two; and an average, longitudinal extension direction $z_0$ of the middle portion extends in the transverse plane, parallel to said third direction z.

3. The optical amplifier device according to claim 2, wherein said minimal distance is greater than or equal to 4 µm.

4. The optical amplifier device according to claim 2, wherein an average width of said middle portion is between 0.7 and 1.3 µm, said width measured along said second direction y.

5. The optical amplifier device according to claim 4, wherein said tapers are first tapers and the active gain material layer stack further comprises two second tapers that narrow outwardly towards said two opposite ends, respectively, the second tapers extending relative to the first tapers, respectively.

6. The optical amplifier device according to claim 5, wherein the second tapers extend relative to the first tapers such that the footprint of the active gain material layer stack is substantially equal to that of the middle portion and the first tapers measured along the third direction z.

7. The optical amplifier device according to claim 2, wherein a width of each of said two opposite ends is less than 500 nm, said width measured along the second direction y.

8. The optical amplifier device according to claim 2, wherein an average width of each of the input portion and the output portion is at least 2.0 µm, said width measured along the second direction y.

9. The optical amplifier device according to claim 2, wherein each of the two sets of electrical contacts comprises two or more electrical contacts and extends longitudinally along a respective extension direction parallel to said third direction z and an offset between said respective extension direction and said transverse plane is greater than or equal to 4 µm.

10. The optical amplifier device according to claim 9, wherein the two sets of electrical contacts have substantially a same length along their respective extension directions, which are, each, substantially equal to a length of said active gain material layer stack, as measured along said third direction z.

11. The optical amplifier device according to claim 9, further comprising a cladding material that coats, at least partly, said dielectric material layer and the active gain material layer stack.

12. The optical amplifier device according to claim 11, wherein a thickness of said cladding material is between 500 nm and 2 000 nm, said average thickness measured along the first direction x.

13. The optical amplifier device according to claim 9, wherein:

each of the two sets of electrical contacts comprises vias which are each filled with a metallic material that contacts the active gain material layer stack, thereby forming said electrical contacts; and the optical amplifier device further comprises two elongated metal pads on top of the cladding material, each of the two metal pads contacting filled vias in one of the two sets of electrical contacts.

14. The optical amplifier device according to claim 1, wherein an average thickness of said dielectric material layer is between 150 nm and 300 nm, said average thickness measured along said first direction x.

15. The optical amplifier device according to claim 1, wherein an average thickness of the optical waveguide core is 220 nm±20 nm, said average thickness measured along the first direction x.

16. The optical amplifier device according to claim 1, wherein the optical amplifier device is configured as a laser.

17. The optical amplifier device according to claim 16, wherein the optical waveguide core comprises one or more distributed feedback reflectors arranged in said middle portion.

18. The optical amplifier device according to claim 17, wherein the optical waveguide core comprises:

a first sublayer comprising silicon, which first sublayer comprises said one or more distributed feedback reflectors; and a second sublayer, comprising silicon, underneath the first sublayer, said second sublayer opposite to the dielectric layer with respect to the first sublayer of the optical waveguide core.

19. A silicon photonic circuit device, comprising:

at least one optical amplifier device, the at least one optical amplifier device comprising:

an optical waveguide core comprising silicon, the optical waveguide core including: an input portion; a middle portion; an output portion; and tapers, the middle portion connected to the input portion and the output portion via the tapers, the latter widening outwardly, whereby the middle portion has an effective refractive index that is smaller than an effective refractive index of any of the input portion and the output portion;

an active gain material layer stack comprising a stack of III-V semiconductor material layers stacked along a first direction x, said stack of III-V semiconductor material layers having different refractive indices relative to one another such that the active gain material layer stack has an effective refractive index, the latter being larger than an effective refractive index of the middle portion, wherein the active gain material layer stack comprises two opposite ends, including a first end and a second end, the active gain material layer stack extending, from said first end to said second end, relative to a subsection of said optical waveguide core that comprises said middle portion and said tapers, the active gain material layer stack having a footprint substantially equal to that of the middle portion and the tapers of the optical waveguide core;

a dielectric material layer between the active gain material layer stack and the optical waveguide core; and electrical contacts in electrical communication with the active gain material layer stack, the electrical contacts having a length along an extension direction of the contacts that is substantially equal to a length of the active gain material layer stack.

20. The device according to claim 19, wherein the photonic circuit device comprises a CMOS front-end-of-line or a bipolar CMOS front-end-of-line, in which said optical waveguide core is arranged.

* * * * *